US010355051B2

(12) United States Patent
Keel et al.

(10) Patent No.: US 10,355,051 B2
(45) Date of Patent: Jul. 16, 2019

(54) SEMICONDUCTOR DEVICE

(71) Applicant: SAMSUNG ELECTRONICS CO., LTD., Suwon-si, Gyeonggi-Do (KR)

(72) Inventors: Min-Sun Keel, Seoul (KR); Sehyeon Kang, Hwaseong-si (KR); Tae-Yon Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 133 days.

(21) Appl. No.: 15/632,751

(22) Filed: Jun. 26, 2017

(65) Prior Publication Data
US 2018/0151626 A1 May 31, 2018

(30) Foreign Application Priority Data

Nov. 28, 2016 (KR) .......................... 10-2016-0159663

(51) Int. Cl.
| H01L 27/30 | (2006.01) |
| H04N 5/378 | (2011.01) |
| H04N 5/341 | (2011.01) |
| H04N 5/369 | (2011.01) |
| H01L 27/146 | (2006.01) |

(52) U.S. Cl.
CPC .......... *H01L 27/307* (2013.01); *H01L 27/146* (2013.01); *H01L 27/1461* (2013.01); *H01L 27/14645* (2013.01); *H01L 27/14665* (2013.01); *H04N 5/341* (2013.01); *H04N 5/378* (2013.01); *H04N 5/379* (2018.08); *H01L 27/1464* (2013.01)

(58) Field of Classification Search
CPC ............ H01L 27/307; H01L 27/14665; H01L 27/14645; H01L 27/146; H01L 27/1461; H01L 27/1464; H04N 5/379; H04N 5/341; H04N 5/378
USPC ...................................... 250/208.1
See application file for complete search history.

(56) References Cited

U.S. PATENT DOCUMENTS

| 7,498,624 | B2 | 3/2009 | Suzuki |
| 7,667,750 | B2 | 2/2010 | Goto et al. |
| 7,948,545 | B2 | 5/2011 | Suzuki |
| 9,287,302 | B2 | 3/2016 | Egawa |
| 9,287,327 | B2 | 3/2016 | Lee et al. |
| 9,350,930 | B2 | 5/2016 | Lee et al. |
| 9,455,289 | B2 * | 9/2016 | Tashiro ............ H01L 27/14621 |
| 9,653,510 | B2 * | 5/2017 | Tamaki ................ H04N 5/3745 |

(Continued)

*Primary Examiner* — Seung C Sohn
(74) *Attorney, Agent, or Firm* — F. Chau & Associates, LLC

(57) ABSTRACT

An image sensor includes a plurality of row lines extending in a first direction, a plurality of column lines including a plurality of first column lines and a plurality of second column lines, the plurality of column lines intersects the plurality of row lines, and a plurality of pixels arranged along the plurality of row lines and the plurality of column lines, the plurality of pixels includes a plurality of pixel groups, each of the plurality of pixel groups includes two or more pixels. Each pixel includes a first photoelectric element, a second photoelectric element, a first pixel circuit connected to the first photoelectric element, and a second pixel circuit connected to the second photoelectric element. In each pixel group, the first pixel circuits share one of the plurality of first column lines and the second pixel circuits share one of the plurality of second column lines.

20 Claims, 16 Drawing Sheets

(56) References Cited

U.S. PATENT DOCUMENTS

2007/0291144 A1 12/2007 Suzuki
2013/0314574 A1 11/2013 Ishii et al.

* cited by examiner

SEMICONDUCTOR DEVICE

CROSS-REFERENCE TO RELATED APPLICATION

This application claims priority under 35 U.S.C. § 119 to Korean Patent Application No. 10-2016-0159663, filed on Nov. 28, 2016, in the Korean Intellectual Property Office, the disclosure of which is incorporated by reference herein in its entirety.

TECHNICAL FIELD

The present inventive concept relates to an image sensor.

DISCUSSION OF THE RELATED ART

Image sensors are semiconductor-based sensors that receive light to generate electrical signals. An image sensor may include pixel arrays having a plurality of pixels, driving circuits to drive the pixel arrays, and the like. An image sensor may be used in a smartphone, a tablet personal computer (PC), laptop computers, televisions, and the like, in addition to cameras and video cameras. Research is being conducted in image sensors which have photoelectric elements generating electrical charges from light of different colors.

SUMMARY

According to an exemplary embodiment of the inventive concept, an image sensor includes a plurality of row lines extending in a first direction, a plurality of column lines including a plurality of first column lines and a plurality of second column lines, wherein the plurality of column lines intersects the plurality of row lines, and a plurality of pixels arranged along the plurality of row lines and the plurality of column lines, wherein the plurality of pixels includes a plurality of pixel groups, wherein each of the plurality of pixel groups includes two or more pixels. Each pixel of the plurality of pixels includes a first photoelectric element, a second photoelectric element, a first pixel circuit connected to the first photoelectric element, and a second pixel circuit connected to the second photoelectric element. In each pixel group of the plurality pixel groups, the first pixel circuits share one of the plurality of first column lines and the second pixel circuits share one of the plurality of second column lines.

According to an exemplary embodiment of the inventive concept, an image sensor includes a plurality of row lines, a plurality of column lines crossing the plurality of row lines, and a plurality of pixels arranged along the plurality of row and column lines. Each of the plurality of pixels includes an organic photodiode for generating first charges from light having a first wavelength band, a semiconductor photodiode for generating second charges from light having a second wavelength band different from the first wavelength band, wherein the organic and semiconductor photodiodes are stacked on each other, a first pixel circuit generating a first pixel signal from the first charges, and a second pixel circuit generating a second pixel signal from the second charges. A plurality of first pixel circuits of a group of adjacent pixels of the plurality of pixels is connected to a first column line of the plurality of column lines, and a plurality of second pixels circuits of the plurality of the group of adjacent pixels is connected to a second column line of the plurality of column lines. During a scanning period, the first pixel circuit of only one of the group of adjacent pixels transmits the first pixel signal to the first column line, and the second pixel circuit of only one of the group of adjacent pixels transmits the second pixel signal to the second column line.

According to an exemplary embodiment of the inventive concept, an image sensor includes a plurality of pixels arranged in a matrix form, a plurality of row lines, and plurality of column lines intersecting the plurality of row lines. Each pixel of the plurality of pixels includes a first photoelectric element for detecting light of a first color, a second photoelectric element for detecting light of a second color different from the first color, a first pixel circuit connected to the first photoelectric element, and a second pixel circuit connected to the second photoelectric element. A first pixel group of the plurality of pixels includes a first pixel and a second pixel, the first pixel circuit of each of the first and second pixels is connected to a first column line, and the second pixel circuit of each of the first and second pixels is connected to a second column line. A second pixel group of the plurality of pixels includes a third pixel and a fourth pixel, the first pixel circuit of each of the third and fourth pixels is connected to a third column line, and the second pixel circuit of each of the third and fourth pixels is connected to a fourth column line. The first and third column lines are connected to a first readout circuit, and the second and fourth column lines are connected to a second readout circuit.

BRIEF DESCRIPTION OF THE DRAWINGS

The above and other features of the inventive concept will become more apparent by describing in detail exemplary embodiments thereof in conjunction with the accompanying drawings, in which.

DETAILED DESCRIPTION OF THE EMBODIMENTS

Figure 1:
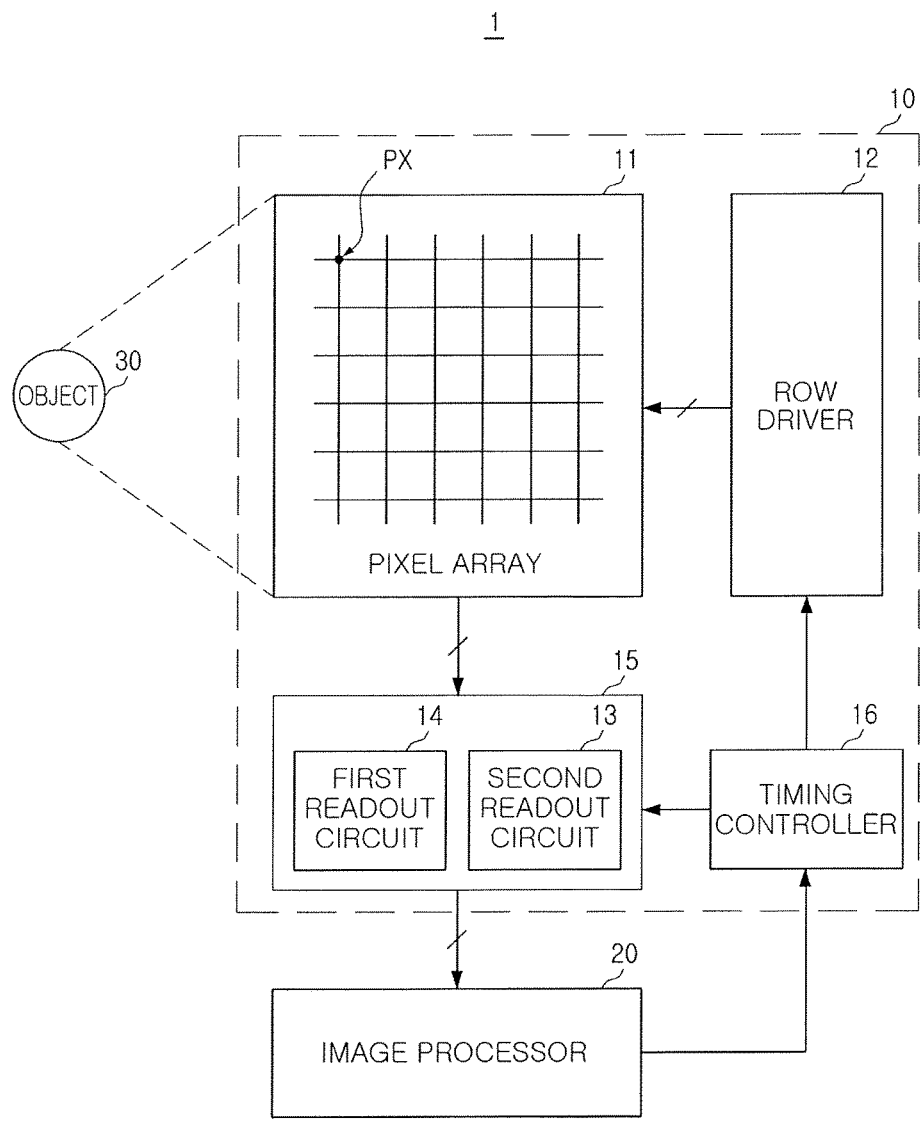
FIG. 1 is a block diagram illustrating an image processing apparatus according to an exemplary embodiment of the inventive concept.

Exemplary embodiments of the inventive concept will be described hereinafter in detail with reference to the accompanying drawings. The proportions of elements in the drawings may be exaggerated for clarity. Like reference numerals may refer to like elements throughout the specification.

FIG. 1 is a block diagram illustrating an image processing apparatus according to an exemplary embodiment of the inventive concept.

With reference to FIG. 1, an image processing apparatus 1, according to an exemplary embodiment of the inventive concept, may include an image sensor 10 and an image processor 20. The image sensor 10 may include a pixel array 11, a row driver 12, a readout circuit 15, a timing controller 16, and the like.

The image sensor 10 may operate according to a control command of the image processor 20, and may convert light from an object 30 into an electrical signal. The image sensor 10 may output the electrical signal to the image processor 20. The pixel array 11 may include a plurality of pixels PX arranged in a plurality of rows and a plurality of columns. The plurality of pixels PX may respectively include a photoelectric element, for example, a photodiode, receiving light. The photoelectric element may generate an electrical charge. In an exemplary embodiment of the inventive concept, each of the plurality of pixels PX may include two or more photoelectric elements, and the two or more photoelectric elements included in a pixel PX may receive light of different colors to generate electrical charges. The two or more photoelectric elements included in a pixel PX may be stacked on each other, and at least one photoelectric element may be an organic photodiode. The organic photodiode may include an organic material.

Each of the plurality of pixels PX may include a pixel circuit generating a pixel signal from the electrical charge generated by the photoelectric element. In an exemplary embodiment of the inventive concept, the pixel circuit may include a plurality of transistors, and may include a driving transistor, a selection transistor, a reset transistor, and the like. For example, when a pixel PX includes two or more photoelectric elements, each pixel PX may include two or more pixel circuits to process charges respectively generated by the two or more photoelectric elements. In an exemplary embodiment of the inventive concept, for example, when the first and second photoelectric elements are included in a pixel PX, the pixel circuits may include first and second pixel circuits respectively connected to the first and second photoelectric elements to generate first and second pixel signals. The first and second pixel circuits may be different from each other.

The row driver 12 may drive the pixel array 11 on a per-pixel PX-row basis. For example, the row driver 12 may generate a signal controlling transistors included in the pixel circuits.

The readout circuit 15 may include a first readout circuit 14 and a second readout circuit 13. Each of the first readout circuit 14 and the second readout circuit 13 may include a correlated double sampler (CDS), an analog-to-digital converter (ADC), and the like. The CDS may receive pixel signals from pixels PX connected to a row, driven by the row driver 12, to perform correlated double sampling. The ADC may convert an output from the CDS into a digital signal.

The first readout circuit 14 may be connected to the plurality of pixels PX through a plurality of first column lines, and the second readout circuit 13 may be connected to the plurality of pixels PX through a plurality of second column lines. In an exemplary embodiment of the inventive concept, the first pixel circuit included in a pixel PX may be connected to the first readout circuit 14 via a first column line, and the second pixel circuit may be connected to the second readout circuit 13 via a second column line.

The readout circuit 15 may include a latch or buffer circuit temporarily storing a digital signal generated by the ADC, an amplification circuit, and the like. The readout circuit 15 may temporarily store or amplify the digital signal generated by the ADC to generate image data. The row driver 12, the readout circuit 15, and the like, may be operated by the timing controller 16. The timing controller 16 may be operated by a control command transmitted by the image processor 20. The image processor 20 may control the row driver 12 and the readout circuit 15 through the timing controller 16. The image processor 20 may output image data transferred by the readout circuit 15 to a display device, or the like, or may store the image data in a storage device such as a memory, or the like.

Figure 2:
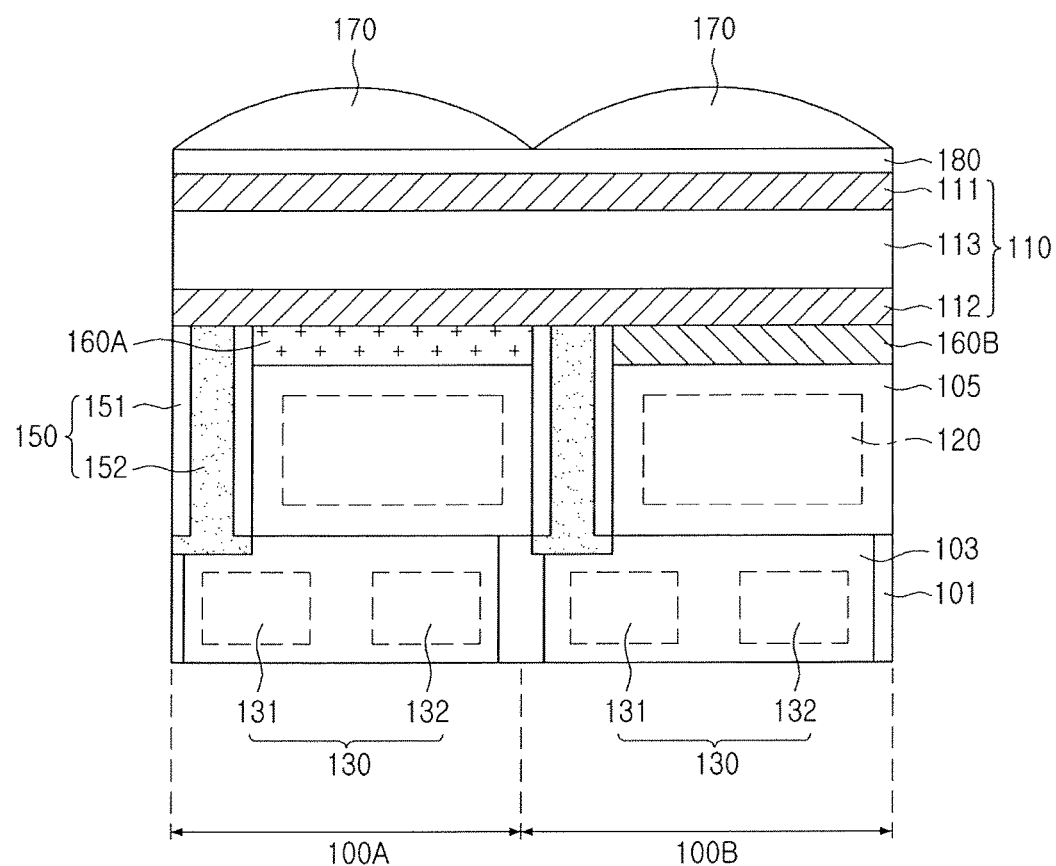
FIGS. 2 and 3 are cross-sectional views illustrating pixels included in an image sensor according to exemplary embodiments of the inventive concept.
Figure 3:
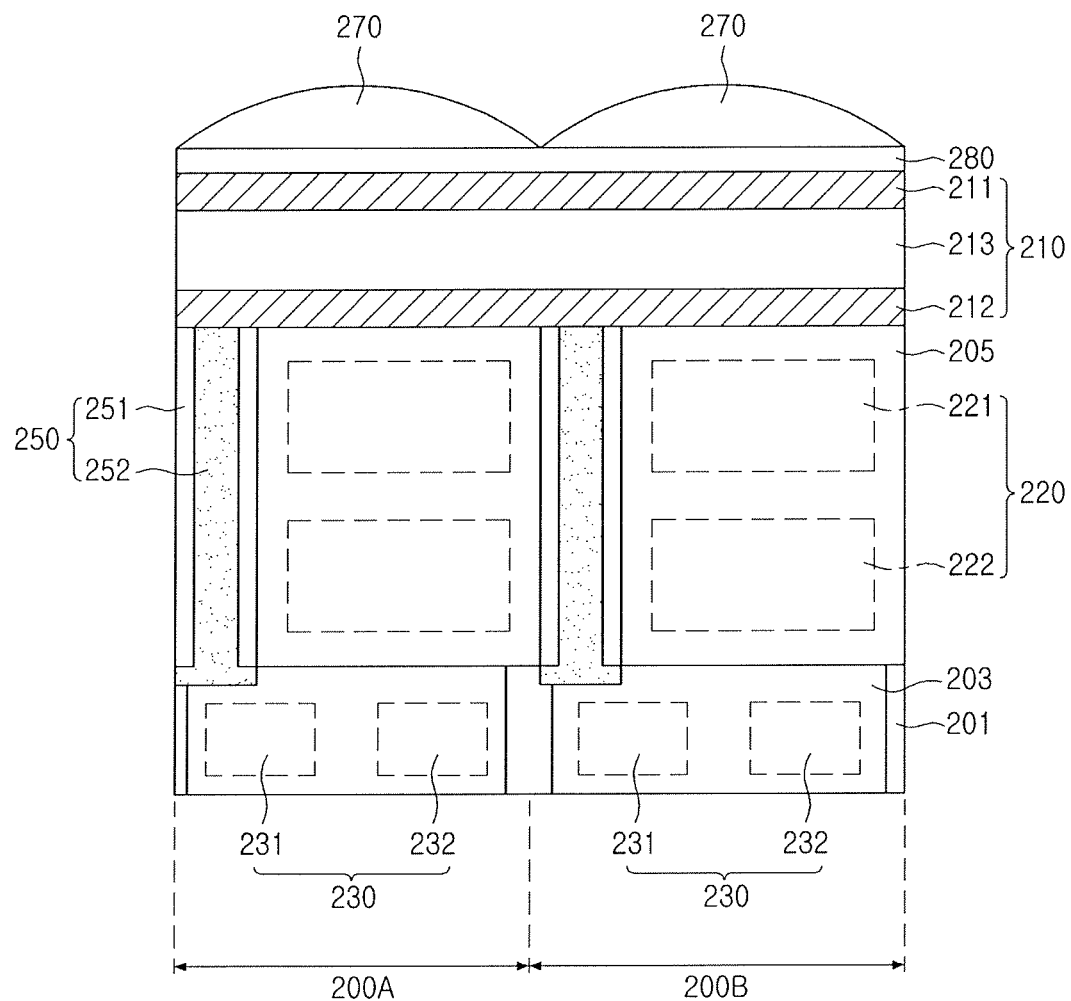

FIGS. 2 and 3 are cross-sectional views illustrating pixels included in an image sensor according to exemplary embodiments of the inventive concept.

With reference to FIG. 2, each of pixels 100A and 100B included in an image sensor 10, according to an exemplary embodiment of the inventive concept, may include a first photoelectric element 110, a second photoelectric element 120, a pixel circuit 130, and the like. The first photoelectric element 110 and the second photoelectric element 120 may be provided below a micro lens 170 and a protective layer 180, and the pixel circuit 130 may be provided below the first photoelectric element 110 and the second photoelectric element 120. The image sensor 10, according to an exemplary embodiment of the inventive concept, may be a back side illumination image sensor.

The pixels 100A and 100B may be arranged in the form of an M×N matrix in the pixel array 11 of the image sensor 10, where M and N are natural numbers equal to or greater than 2. A separation region 101, preventing crosstalk, may be provided between the pixels 100A and 100B adjacent to each other. A first color filter 160A and a second color filter 160B, respectively included in the neighboring first pixel 100A and the second pixel 100B, may allow light of different colors to pass therethrough. In an exemplary embodiment of the inventive concept, the first color filter 160A may allow red color light and the second color filter 160B may allow blue color light, to pass therethrough. The red and blue lights may respectively be transmitted to the second photoelectric elements 120 of the pixels 100A and 100B.

Each of the pixels 100A and 100B may include the first and second photoelectric elements 110 and 120 stacked on each other. The first and second photoelectric elements 110 and 120 may receive light of different colors and generate electrical charges. In an exemplary embodiment of the inventive concept, the first photoelectric element 110 may be an organic photoelectric element, for example, an organic photodiode, and the second photoelectric element 120 may be a semiconductor photoelectric element, for example, a silicon photodiode. The second photoelectric elements 120 of the pixels 100A and 100B may be formed in a semiconductor substrate 105, and may receive light that passes through the first and second color filters 160A and 160B to generate a charge carrier. The color of the light passing through the first and second color filters 160A and 160B may be different from the color of the light received by the first photoelectric element 110.

The first photoelectric element 110 may include upper and lower electrode layers 111 and 112 opposing each other, and a color selection layer 113 disposed therebetween. The color selection layer 113 may generate an electrical charge from light by photoelectric effects and may include an organic material. The color selection layer 113 may include a p-type layer in which a main carrier is a hole, and an n-type layer in which a main carrier is an electron. The color selection layer 113 may generate an electrical charge in response to light of a specific wavelength band. In an exemplary embodiment of the inventive concept, color selection layer 113 may generate an electrical charge in response to a green light. Wavelengths of light having colors other than green may be transmitted to the second photoelectric element 120 through the color filters 160A and 160B.

The upper and lower electrode layers 111 and 112 may include a transparent conductive material, such as ITO, IZO, ZnO, or SnO$_2$, or the like, or the upper and lower electrode layers 111 and 112 may include a semi-transparent material, such as a metal thin film material. In an exemplary embodiment of the inventive concept, the upper electrode layer 111 may have a work function greater than or equal to a work function of the lower electrode layer 112.

The pixel circuit 130 may include a first pixel circuit 131 and a second pixel circuit 132 formed in a well region 103. The first pixel circuit 131 may be connected to the first photoelectric element 110, and may generate a first pixel signal from the electrical charge generated by the first photoelectric element 110. The second pixel circuit 132 may be connected to the second photoelectric element 120 and may generate a second pixel signal from the electrical charge generated by the second photoelectric element 120.

The first pixel circuit 131 may be connected to the first photoelectric element 110 by a via 150. The via 150 may be a micro-through silicon via (μTSV). The via 150 may include an insulating portion 151 and a conductive portion 152. The conductive portion 152 may extend along a sidewall of the pixels 100A and 100B to electrically connect the first photoelectric element 110 to the first pixel circuit 131. In an exemplary embodiment of the inventive concept, a first surface of the conductive portion 152 may be connected to the lower electrode layer 112 of the first photoelectric element 110, and a second surface of the conductive portion 152 may be connected to one of a plurality of circuit elements included in the first pixel circuit 131. In an exemplary embodiment of the inventive concept, the conductive portion 152 may be directly connected to a floating diffusion node included in the first pixel circuit 131. The insulating portion 151 may include an insulating material, such as SiO$_2$, SiN, Al$_2$O$_3$, HfOx, or the like.

The first pixel circuit 131 and the second pixel circuit 132 may include circuits that are different from each other. In an exemplary embodiment of the inventive concept, the first pixel circuit 131 may be implemented by a three transistor (3T) circuit not including a transfer transistor, and the second pixel circuit 132 may be implemented by a four transistor (4T) circuit including a transfer transistor. The first photoelectric element 110 may be connected to the first pixel circuit 131 by the via 150. It may be difficult to include a pinned photo-diode (PPD) structure required for connection with a 4T circuit in the first pixel circuit 131. Thus, the first pixel circuit 131 may be implemented as a 3T circuit that does not include a transfer transistor.

With reference to FIG. 3, each of pixels 200A and 200B included in an image sensor 10, according to an exemplary embodiment of the inventive concept, may include a first photoelectric element 210, a second photoelectric element 220, a pixel circuit 230, and the like. The first photoelectric element 210 and the second photoelectric element 220 may be disposed below a micro lens 270 and a protective layer 280, and the pixel circuit 230 may be disposed below the first photoelectric element 210 and the second photoelectric element 220.

Each of the pixels 200A and 200B, as illustrated with reference to FIG. 3, may include a plurality of second photoelectric elements 220. In an exemplary embodiment of the inventive concept, each of the second photoelectric elements 220 may include an upper photoelectric element 221 and a lower photoelectric element 222. The upper photoelectric element 221 and the lower photoelectric element 222 may receive light of different colors to generate electrical charges. In an exemplary embodiment of the inventive concept, the lower photoelectric element 222 may receive light having a longer wavelength band than a wavelength band of the upper photoelectric element 221 For example, the lower photoelectric element 222 may generate electrical charges in response to red light, and the upper photoelectric element 221 may generate electrical charges in response to blue light.

As illustrated in FIG. 3, a second pixel circuit 232 may include a plurality of circuits connected to the second photoelectric elements 220. In an exemplary embodiment of the inventive concept, a circuit of the second pixel circuit 232, which is connected to the upper photoelectric element 221, may be implemented as a 3T circuit, such as a first pixel circuit 231. In addition, a circuit of the second pixel circuit 232, connected to the lower photoelectric element 222, may be implemented as a 4T circuit. Since the upper photoelectric element 221 is connected to the second pixel circuit 232 by a via in a manner similar to the first photoelectric element 210, the upper photoelectric element 221 may not have a PPD structure required for the 4T circuit. Thus, the upper photoelectric element 221 may be connected to a 3T circuit not including a transfer transistor.

Figure 4A:
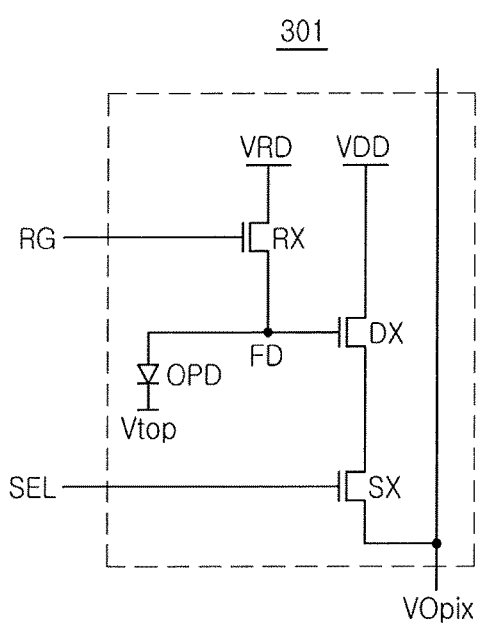
FIGS. 4A and 4B are circuit diagrams illustrating pixel circuits included in an image sensor, according to exemplary embodiments of the inventive concept.
Figure 4B:
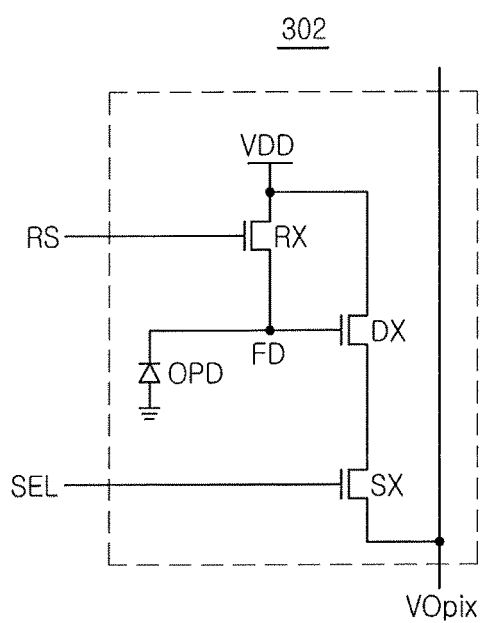

FIGS. 4A and 4B are circuit diagrams illustrating pixel circuits included in an image sensor, according to exemplary embodiments of the inventive concept. The pixel circuits illustrated in FIGS. 4A and 4B may correspond to the first pixel circuit 131 illustrated in FIG. 2, and the first pixel circuit 231 illustrated in FIG. 3.

A first pixel circuit 301 illustrated in FIG. 4, according to an exemplary embodiment of the inventive concept, may include a plurality of transistors RX, DX and SX, and may have a 3T circuit structure. In an exemplary embodiment of the inventive concept, the first pixel circuit 301 may include a reset transistor RX, a driving transistor DX, and a selection transistor SX. A gate terminal of the driving transistor DX may be connected to a floating diffusion FD, and charges generated in a first photoelectric element OPD may be accumulated in the floating diffusion FD. In an exemplary embodiment of the inventive concept, the first photoelectric element OPD may be an organic photodiode including an organic material.

The driving transistor DX may operate as a source follower buffer amplifier by the electrical charge accumulated in the floating diffusion FD. The driving transistor DX may amplify the electrical charge accumulated in the floating diffusion FD and transfer the amplified charge to the selection transistor SX.

The selection transistor SX may be operated by a selection control signal SEL input by a row driver (e.g., the row driver 12) and may perform switching and addressing operations. For example, when the selection control signal SEL is applied from the row driver, a first pixel signal VOpix may be output to a first column line connected to the selection transistor SX. The first pixel signal VOpix may be detected by a first readout circuit (e.g., the first readout circuit 14).

The reset transistor RX may be controlled by a reset control signal RG input by the row driver. The reset transistor RX may reset a voltage of the floating diffusion FD to a readout voltage VRD in response to the reset control signal RG.

As illustrated in FIG. 4A, the first photoelectric element OPD may use a hole as a main charge carrier. In the case in which the hole is used as the main charge carrier, a cathode of the first photoelectric element OPD may be connected to the floating diffusion FD, and an anode of the first photoelectric element OPD may be connected to an upper electrode voltage Vtop. In an exemplary embodiment of the inventive concept, the upper electrode voltage Vtop may have several voltages, for example, about 3.0 V. Since holes are generated as the main charge carriers in the first photoelectric element OPD, a drain terminal of the reset transistor RX may be connected to the readout voltage VRD, having a voltage level different from that of a power supply voltage VDD. The first pixel circuit 301, which uses holes as the main charge carriers, may have a low dark current.

With reference to FIG. 4B, a first pixel circuit 302 may be a 3T circuit including a reset transistor RX, a driving transistor DX, and a selection transistor SX. A first photoelectric element OPD shown in FIG. 4 may use electrons as main charge carriers. Since electrons are used as the main charge carriers, an anode of the first photoelectric element OPD may be connected to a floating diffusion FD, and a cathode of the first photoelectric element OPD may be connected to a ground voltage. A drain terminal of the reset transistor RX and a drain terminal of the driving transistor DX may be connected to a power supply voltage VDD.

Figure 5A:
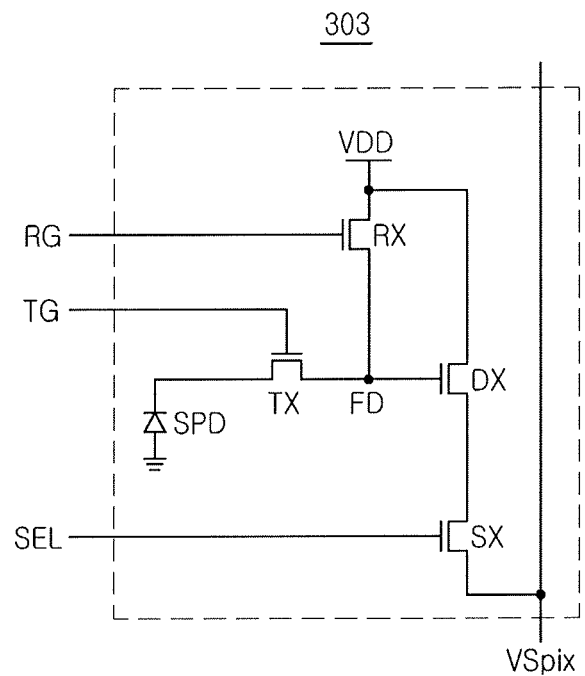
FIGS. 5A and 5B are circuit diagrams illustrating pixel circuits included in an image sensor, according to exemplary embodiments of the inventive concept.
Figure 5B:
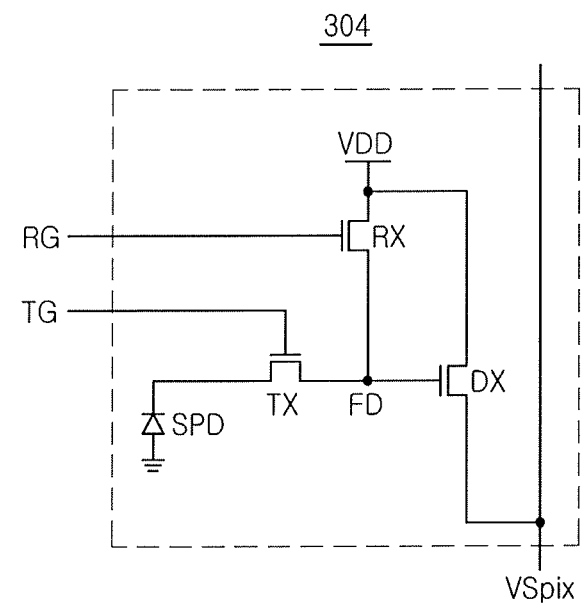

FIGS. 5A and 5B are circuit diagrams illustrating pixel circuits included in an image sensor, according to exemplary embodiments of the inventive concept. The pixel circuits illustrated in FIGS. 5A and 5B may correspond to the second pixel circuit 132 of FIG. 2, and the second pixel circuit 232 of FIG. 3.

Referring to FIG. 5A, a second pixel circuit 303 may be a 4T circuit including four transistors. The second pixel circuit 303 may further include a transfer transistor TX in addition to the reset transistor RX, the driving transistor DX and the selection transistor SX. A second photoelectric element SPD, connected to the second pixel circuit 303, may be a silicon photodiode, and may be connected to a floating diffusion FD through the transfer transistor TX. For example, a cathode or an anode of the second photoelectric element SPD may not be directly connected to the floating diffusion FD.

The transfer transistor TX may transfer charges accumulated in the second photoelectric element SPD to the floating diffusion FD, based on a transfer control signal TG transmitted by the row driver. The second photoelectric element SPD may use an electron as a main carrier. Operations of the reset transistor RX, the driving transistor DX and the selection transistor SX may be similar to those described above with reference to FIGS. 4A and 4B. A second pixel signal VSpix may be output through a second column line connected to the selection transistor SX. The second pixel signal VSpix may be detected by a second readout circuit.

With reference to FIG. 5B, a second pixel circuit 304 may include a driving transistor DX, a reset transistor RX, and a transfer transistor TX. For example, when the transfer transistor TX is turned on in response to the transfer control signal TG, an electrical charge generated in the second photoelectric element SPD may be transferred to the floating diffusion FD, and the driving transistor DX may amplify the electrical charge to output a second pixel signal VSpix.

The second pixel circuit 303 or 304, connected to the second photoelectric element SPD, may include the transfer transistor TX. The transfer transistor TX may be controlled by the transfer control signal TG, transmitted from the row driver. Since it is determined whether the electrical charge generated in the second photoelectric element SPD is transferred to the floating diffusion FD by the transfer control signal TG, the second pixel circuits 303 and 304, included in adjacent pixels PX, may share the driving transistor DX, the reset transistor RX, the selection transistor SX, and the like, except the transfer transistor TX. Thus, since the second pixel circuits 303 and 304, included in the adjacent pixels, may share a single second column line, a degree of integration of the circuits may be reduced.

In an exemplary embodiment of the inventive concept, the first pixel circuits 301 and 302 of adjacent pixels PX may share a single first column line. In addition, the manner in which the first pixel circuits 301 and 302 included in adjacent pixels PX share a single first column line may be identical to the manner in which the second pixel circuits 303 and 304 of adjacent pixels PX share a single second column line. Thus, the noise occurring in a process of detecting the first pixel signal VOpix and the second pixel signal VSpix through the respective first and second column lines may be reduced. In addition, since the first readout circuit and the second readout circuit respectively detect the first pixel signal VOpix and the second pixel signal VSpix, a data reordering process may be simplified.

Figure 6:
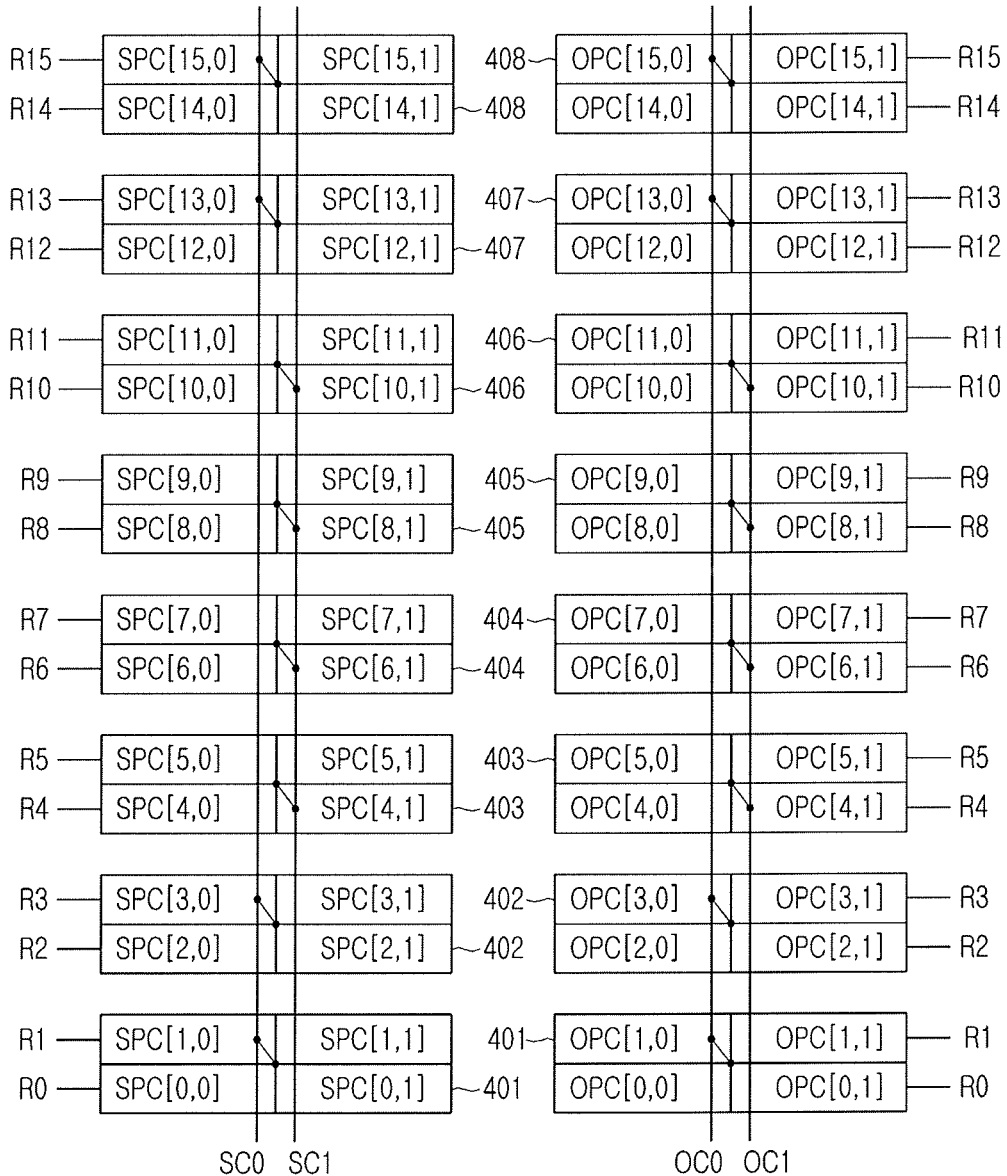
FIG. 6 is a diagram illustrating a connection structure of pixel circuits and column lines included in an image sensor, according to an exemplary embodiment of the inventive concept.

FIG. 6 is a diagram illustrating a connection structure of pixel circuits and column lines included in an image sensor, according to an exemplary embodiment of the inventive concept.

Referring to FIG. 6, an image sensor may include a plurality of pixels PX, and portions of the plurality of pixels PX, for example, adjacent pixels PX, may form a single pixel group. Although FIG. 6 only illustrates 32 pixels PX and 8 pixel groups 401 to 408, it is to be understood that the number of pixels PX included in an image sensor may be varied as needed. Each of the pixel groups 401 to 408 may include four pixels PX, and four pixels PX included in each of the pixel groups 401 to 408 may be arranged in a 2×2 matrix. The number of pixels PX included in each of the pixel groups 401 to 408 and an arrangement form thereof may be variously modified.

Referring to FIG. 6, for convenience of description, a first pixel circuit connected to a first photoelectric element and a second pixel circuit connected to a second photoelectric element in respective pixels PX, and pixel groups 401 to 408, are separately illustrated. In an exemplary embodiment of the inventive concept, with reference to FIG. 6, first pixel circuits, for example, organic pixel circuits (OPC) connected to organic photodiodes, are illustrated on the right of the drawing, and second pixel circuits, for example, silicon pixel circuits (SPC) connected to silicon photodiodes, are illustrated on the left of the drawing. Since in an image sensor each of the pixels PX includes both the first pixel circuit OPC and the second pixel circuit SPC, the first and second pixel circuits OPC and SPC may be overlapped with each other.

The first pixel circuits OPC and the second pixel circuits SPC included in respective pixels PX may be connected to column lines OC0, OC1, SC0 and SC1 and row lines R0 to R15. For example, in respective pixel groups 401 to 408, the first pixel circuits OPC may be connected to the first column lines OC0 and OC1, and the second pixel circuits SPC may be connected to the second column lines SC0 and SC1. In an exemplary embodiment of the inventive concept, the first pixel circuits OPC of pixels PX included in each of the pixel groups 401 to 408 may share one of the first column lines OC0 and OC1. The second pixel circuits SPC of pixels PX included in each of the pixel groups 401 to 408 may share one of the second column lines SC0 and SC1.

Referring to FIG. 6, the first pixel circuits OPC of pixels PX included in the first pixel group 401 may share the first column line OC0. The second pixel circuits SPC of pixels PX included in the first pixel group 401 may share the second column line SC0. The first pixel circuits OPC included in pixels PX of the second pixel group 402 may share the first column line OC0, and the second pixel circuits SPC of the second pixel group 402 may share the second column line SC0. The first pixel circuits OPC of pixels PX included in each of the third to sixth pixel groups 403 to 406 may share the first column line OC1, and the second pixel circuits SPC of the third to sixth pixel groups 403 to 406 may share the second column line SC1.

In an exemplary embodiment of the inventive concept, with reference to FIG. 6, first pixel signals output by the first pixel circuits OPC connected to different first column lines OC0 and OC1 may be simultaneously detected. In addition, second pixel signals output by the second pixel circuits SPC connected to different second column lines SC0 and SC1 may be simultaneously detected. For example, when intersection points of the first and second column lines OC0, OC1, SC0 and SC1 and the row lines R0 to R15 are defined as addresses of respective pixels PX, the first pixel signals, respectively output by a first pixel circuit OPC[0,0] of a pixel PX located at an address [0,0] and by a first pixel circuit OPC[4,0] of a pixel PX located at an address [4,0] may be simultaneously detected by the first readout circuit. Since the first pixel circuit OPC[0,0] of the pixel located at the address [0,0] and the first pixel circuit OPC[4,0] of the pixel located at the address [4,0] are connected to different first column lines OC0 and OC1, the first pixel signals may not be overlapped.

In addition, second pixel signals, respectively output by a second pixel circuit SPC[0,0] of a pixel located at an address [0,0] and a second pixel circuit SPC[4,0] of a pixel PX located at an address [4,0] may be simultaneously detected by the second readout circuit. Since the second pixel circuit SPC[0,0] of the pixel located at the address [0,0] and the second pixel circuit SPC[4,0] of the pixel located at the address [4,0] are connected to different second column lines SC0 and SC1, the second pixel signals may not be overlapped.

When the first and second pixel signals are detected as described above, the first pixel circuit OPC and the second pixel circuit SPC, in which pixel signals (e.g., the first and second pixel signals) are detected in each scanning period, may be included in a same pixel PX. For example, the pixel signals may not be detected from the first pixel circuit OPC and the second pixel circuit SPC included in different pixels PX during a single scanning period since the first pixel circuit OPC and the second pixel circuit SPC are included in a same pixel PX. Thus, a noise component occurring due to a difference in pixel coordinates between pixels PX, by which a pixel signal is detected during a single scanning period, may be reduced. In addition, since the pixel signals are detected from the first pixel circuit OPC and the second pixel circuit SPC included in the same pixel PX during each scanning period, a re-ordering process in which after the pixel signals are converted into digital image data, the digital image data is arranged according to pixel addresses, may be simplified.

Figure 7A:
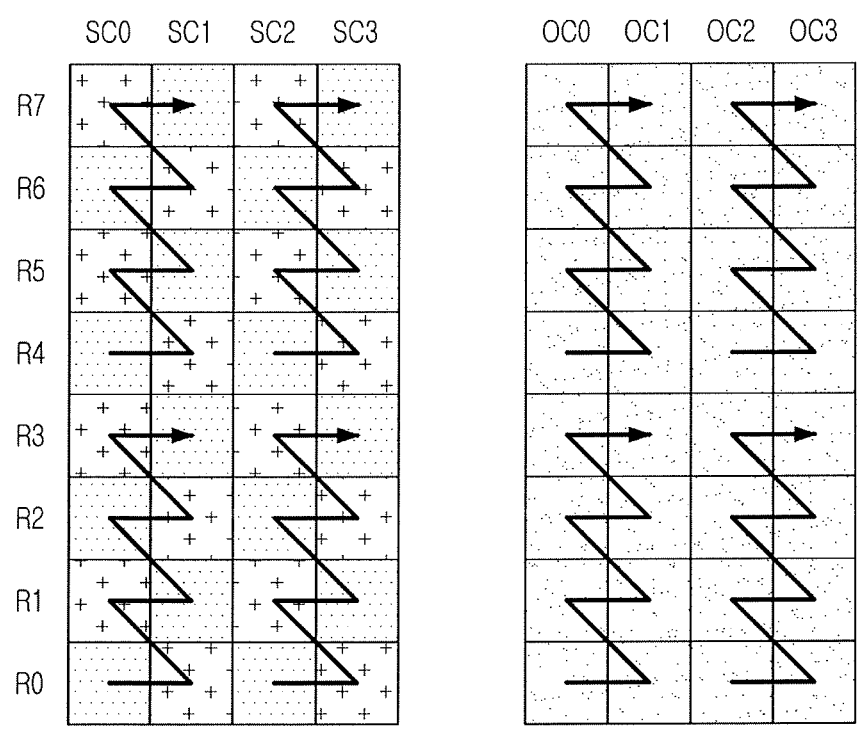
FIGS. 7A and 7B are diagrams illustrating a pixel signal detection method of an image sensor according to an exemplary embodiment of the inventive concept.
Figure 7B:
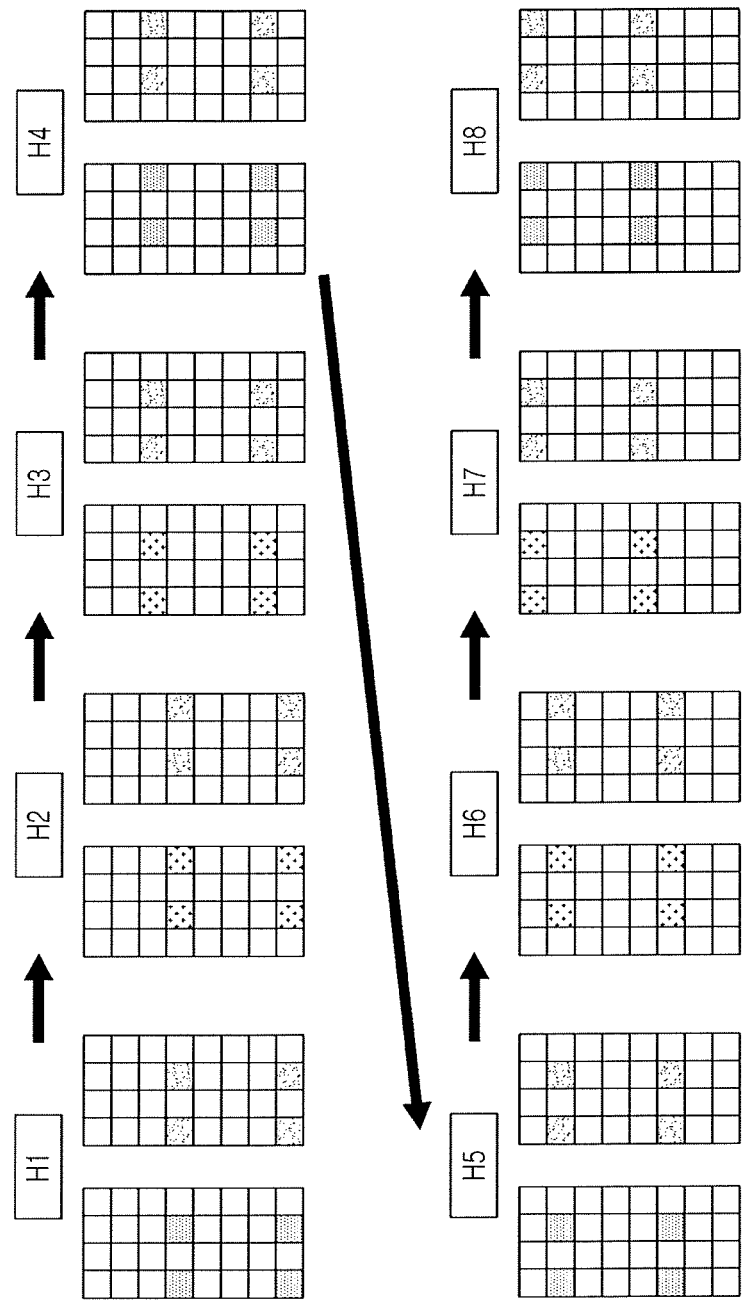

FIGS. 7A and 7B are diagrams illustrating a pixel signal detection method of an image sensor according to an exemplary embodiment of the inventive concept.

Referring to FIG. 7A, pixels PX arranged at intersections of row lines R0 to R7 and column lines OC0 to OC3 and SC0 to SC3 are illustrated. The first column lines OC0 to OC3 may be connected to first pixel circuits of respective pixels PX, and the second column lines SC0 to SC3 may be connected to second pixel circuits of respective pixels PX. The pixels PX may receive a selection signal from a row driver via the row lines R0 to R8. The first pixel circuit and the second pixel circuit included in the pixel PX, to which the selection signal is input, may output a first pixel signal to one of the first column lines OC0 to OC3 and a second pixel signal to one of the second column lines SC0 to SC3. For example, in each pixel group, the first pixel circuits may be sequentially connected to one of the plurality of first column lines and the second pixel circuits may be sequentially connected to one of the plurality of second column lines. In addition, in each pixel group, an order in which the first pixel circuits are connected to the one of the plurality of first column lines may be identical to an order in which the second pixel circuits are connected to the one of the plurality of second column lines.

Referring to FIGS. 7A and 7B, pixel signals may be simultaneously detected from a plurality of pixels PX in each scanning period. In a first scanning period H1, the first pixel signal and the second pixel signal may be simultaneously detected from the first pixel circuit and the second pixel circuit included in four respective pixels PX located at addresses [0,0], [4,0], [0,2] and [4,2]. The addresses may correspond to the row and column lines. As described above with reference to FIG. 6, four pixels PX adjacent to each other in a 2×2 matrix form may form a single pixel group, and four pixels PX included in each pixel group may share one of column lines OC0 to OC3 and one of column lines SC0 to SC3. Thus, pixels PX connected to different lines among the column lines OC0 to OC3 and SC0 to SC3 may be selected to detect pixel signals without overlap of the pixel signals.

For example, the first pixel circuit OPC[0,0] (refer to FIG. 6) of the pixel located at the address [0,0] may be connected to the first column line OC0, and the first pixel circuit OPC[4,0] of the pixel located at the address [4,0] may be connected to the first column line OC1. Thus, the first pixel signals respectively generated in the first pixel circuits OPC[0,0] and OPC[4,0] may be detected without signal interference.

In a second scanning period H2, occurring after the first scanning period has ended, first and second pixel signals may be simultaneously detected from four pixels PX located at addresses [0,1], [4,1], [0,3] and [4,3]. In a third scanning period H3 occurring subsequently, first and second pixel signals may be simultaneously detected from four pixels PX located at addresses [1,0], [5,0], [1,2] and [5,2]. In a fourth scanning period H4, occurring after the third scanning period H3, first and second pixel signals may be simultaneously detected from four pixels PX located at addresses [1,1], [5,1], [1,3] and [5,3]. As the first to fourth scanning periods H1 to H4 have elapsed, the detection of pixel signals in which the pixels PX included in the four pixel groups are output may be completed. In fifth to eighth scanning periods H5 to H8, pixel signals may be detected from pixels PX included in the other four pixel groups from which pixel signals are not detected in the first to fourth scanning periods H1 to H4, as shown in FIG. 7B.

As illustrated in FIGS. 7A and 7B, during each scanning period of the scanning periods H1 to H8, the first pixel signal and the second pixel signal may be detected from the first pixel circuit and the second pixel circuit included in a same pixel PX, for each of the selected pixels PX. Thus, since a coupling component between pixels PX, generated in each of the scanning periods H1 to H8, is not significantly changed, occurrence of horizontal fixed pattern noise (HFPN) may be reduced. In addition, since during each of the scanning periods H1 to H8, the first and second pixel signals are detected from the first and second pixel circuits included in a same pixel PX, a design of a row driver may be simplified. Furthermore, a data reordering process of aligning image data generated from the first and second pixel signals, according to pixel addresses, may be simplified.

Figure 8:
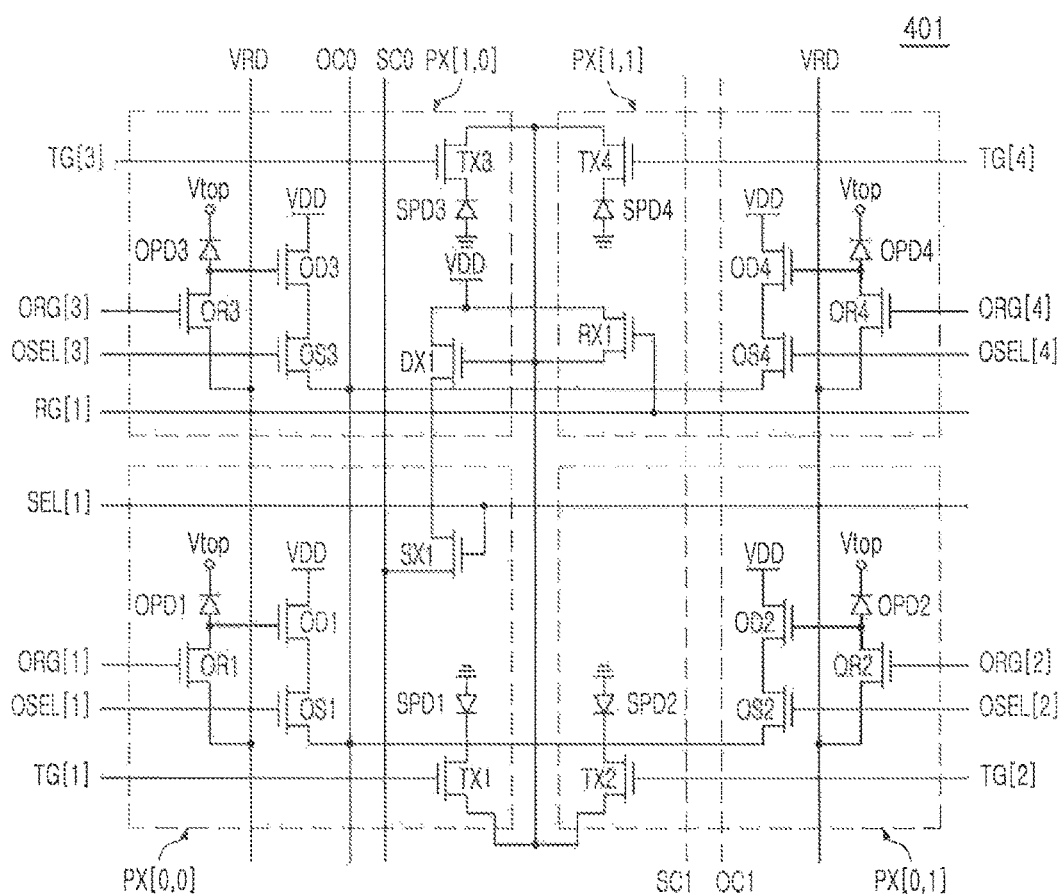
FIGS. 8 and 9 are circuit diagrams illustrating a connection structure of pixel circuits and column lines included in an image sensor according to an exemplary embodiment of the inventive concept.
Figure 9:
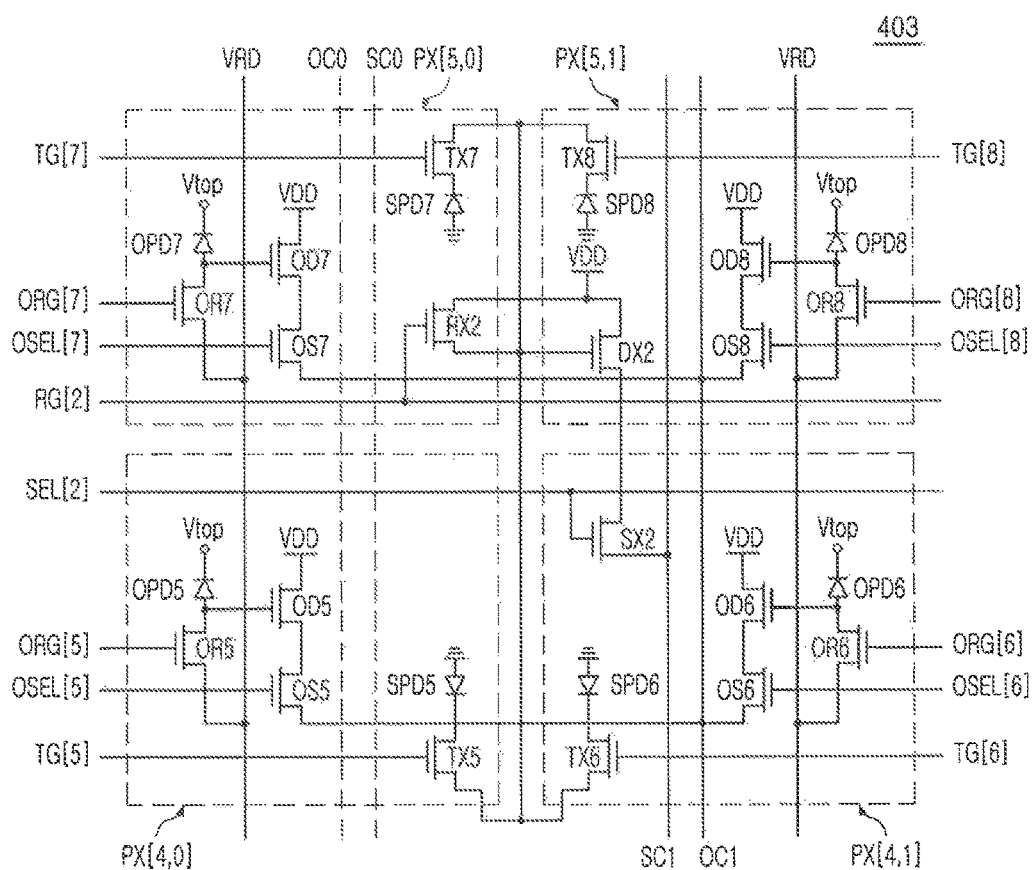

FIGS. 8 and 9 are circuit diagrams illustrating a connection structure of pixel circuits and column lines included in an image sensor according to an exemplary embodiment of the inventive concept. For example, FIG. 8 is a circuit diagram illustrating a connection structure of pixel circuits and column lines corresponding to the first pixel group 401 of FIG. 6, according to an exemplary embodiment of the inventive concept. FIG. 9 is a circuit diagram illustrating a connection structure of pixel circuits and column lines corresponding to the third pixel group 403 of FIG. 6, according to an exemplary embodiment of the inventive concept.

Referring to FIG. 8, a first pixel group 401 may include four pixels PX arranged in a 2×2 matrix. Each of the four pixels PX included in the first pixel group 401 may include a first pixel circuit and a second pixel circuit. The first pixel circuits may be connected to organic photodiodes OPD1 to OPD4 and generate first pixel signals. The second pixel circuits may be connected to semiconductor photodiodes SPD1 to SPD4 and generate second pixel signals. The first pixel group 401 may be connected to a first column line OC0 and a second column line SC0. The first column line OC0 may output a first pixel signal, and the second column line SC0 may output a second pixel signal.

The first pixel circuits may be respectively implemented by a 3T circuit including three transistors. For example, a first pixel circuit of a pixel PX[0,0], corresponding to an address [0,0], may include a reset transistor OR1, a driving transistor OD1, and a selection transistor OS1. The reset transistor OR1 and the selection transistor OS1 may be respectively controlled by a reset signal ORG[1] and a selection signal OSEL[1], input by a row driver. In each scanning period, the row driver may turn on only one of four selection transistors OS1 to OS4 included in the first pixel circuits of the first pixel group 401. Thus, four first pixel circuits included in the first pixel group 401 may share the first column line OC0.

The second pixel circuits may be respectively implemented by a 4T circuit including four transistors. For example, a second pixel circuit of a pixel PX[0,0], corresponding to an address [0,0], may include a transmission transistor TX1, a reset transistor RX1, a driving transistor DX1, and a selection transistor SX1. The reset transistor RX1, the driving transistor DX1, and the selection transistor SX1 may be connected to transmission transistors TX2 to TX4 included in different pixels PX. For example, the second pixel circuits included in the first pixel group 401 may share the reset transistor RX1, the driving transistor DX1, and the selection transistor SX1.

The transmission transistors TX1 to TX4 included in the second pixel circuits may be controlled by different transmission signals TG[1] to TG[4], respectively. In each scanning period, the row driver may turn on only one of the transmission transistors TX1 to TX4 using the transmission signals TG[1] to TG[4]. Thus, four second pixel circuits included in the first pixel group 401 may share the reset transistor RX1, the driving transistor DX1, the selection transistor SX1, and the second column line SC0. An output order of the first and second pixel signals through the first column line OC0 and the second column line SC0 may be similar to that described above with reference to FIGS. 7A and 7B.

The selection transistor OS1 of the pixel PX[0,0], corresponding to the address [0,0], may be turned on in the first scanning period H1. During the first scanning period H1, all other selection transistors OS2 to OS4 included in other pixels PX may be turned off. Thus, the first pixel signal generated by the first pixel circuit of the pixel PX[0,0], corresponding to the address [0,0], may be output through the first column line OC0 during the first scanning period H1.

Simultaneously, in the first scanning period H1, the transmission transistor TX1 of the pixel PX[0,0], corresponding to the address [0,0], may be turned on. During the first scanning period H1, all other transmission transistors TX2 to TX4 included in other pixels PX may be turned off. Thus, the second pixel signal generated by the second pixel circuit of the pixel PX[0,0], corresponding to the address [0,0], may be output through the second column line SC0 during the first scanning period H1. Thus, by turning on only one of the selection transistors OS1 to OS4 in each of the first to fourth scanning periods H1 to H4, the first pixel circuits included in the first pixel group 401 may share a single first column line OC0. In addition, by turning on only one of the transmission transistors TX1 to TX4 in each of the first to fourth scanning periods H1 to H4, the second pixel circuits included in the first pixel group 401 may share a single second column line SC0.

Referring to FIG. 9, a third pixel group 403 may have a structure similar to that of the first pixel group 401. For example, each of four pixels PX included in the third pixel group 403 may include a first pixel circuit and a second pixel circuit. The four first pixel circuits included in the third pixel group 403 may share a single first column line OC1, and four second pixel circuits included in the third pixel group 403 may share a single second column line SC1.

The first column line OC1 shared by the first pixel circuits included in the third pixel group 403 may be different from the first column line OC0 shared by the first pixel circuits included in the first pixel group 401. The second column line SC1 shared by the second pixel circuits included in the third pixel group 403 may be different from the second column line SC0 shared by the second pixel circuits included in the first pixel group 401. Thus, pixel signals may be simultaneously detected from the pixels PX included in the first pixel group 401 and the pixels PX included in the third pixel group 403.

In the first scanning period H1, a selection transistor OS5 included in a pixel PX[4,0], corresponding to an address

[4,0], may be turned on, and all other selection transistors OS6 to OS8 included in the other pixels PX of the third pixel group 403 may be turned off. Thus, a first pixel signal generated from an electrical charge of an organic photodiode OPD5 included in the pixel PX[4,0], corresponding to the address [4,0], may be output through the first column line OC1 during the first scanning period H1.

In addition, in the first scanning period H1, a transmission transistor TX5 included in the pixel PX[4,0], corresponding to the address [4,0], may be turned on, and all other transmission transistors TX6 to TX8 included in other pixels PX may be turned off. Thus, a second pixel signal generated from an electrical charge of a semiconductor photodiode SPD4 included in the pixel PX[4,0], corresponding to the address [4,0], may be output through the second column line SC1 during the first scanning period H1. Thus, from the pixels PX included in the pixel groups 401 and 403 sharing the first column lines OC0 and OC1 and the second column lines SC0 and SC1, the first pixel signal and the second pixel signal may be detected simultaneously with each other.

Figure 10:
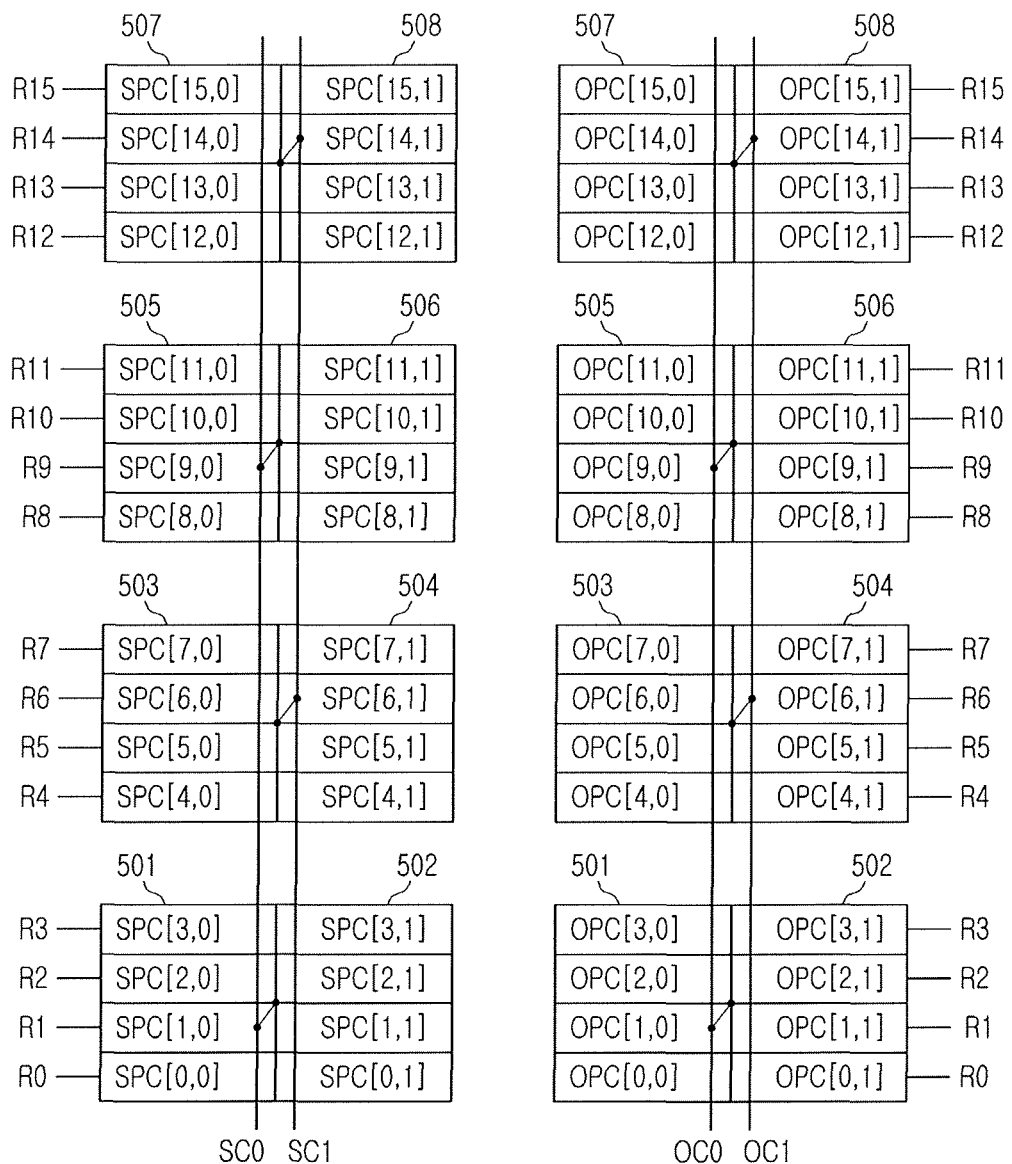
FIG. 10 is a diagram illustrating a connection structure of pixel circuits and column lines included in an image sensor according to an exemplary embodiment of the inventive concept.

FIG. 10 is a diagram illustrating a connection structure of pixel circuits and column lines included in an image sensor according to an exemplary embodiment of the inventive concept.

Referring to FIG. 10, for convenience of description, a first pixel circuit connected to a first photoelectric element, and a second pixel circuit connected to a second photoelectric element in respective pixels PX of pixel groups 501 to 508, are separately illustrated. In FIG. 10, first pixel circuits (OPC) connected to organic photodiodes are illustrated on the right of the drawing, and second pixel circuits (SPC) connected to semiconductor photodiodes are illustrated on the left of the drawing. The first pixel circuit OPC and the second pixel circuit SPC may be included together in each of pixels PX of an image sensor.

The first pixel circuit OPC and the second pixel circuit SPC included in each of pixels PX may be connected to column lines OC0, OC1, SC0 and SC1 and row lines R0 to R15. The pixels PX adjacent to each other may form pixel the groups 501 to 508. In each of the pixel groups 501 to 508, the first pixel circuits OPC may be connected to the first column lines OC0 and OC1, and the second pixel circuit SPC may be connected to the second column lines SC0 and SC1. The pixels PX in each of the pixel groups 501 to 508 of FIG. 10 may be arranged in a 4×1 matrix form. In addition, the pixel circuits included in two pixel groups adjacent each other may share a single column line. For example, the first pixel circuits OPC of the first pixel group 501 may share the first column line OC0 with the first pixel circuits OPC of the second pixel group 502. In addition, the second pixel circuits SPC of the first pixel group 501 may share the second column line SC0 with the second pixel circuits SPC of the second pixel group 502.

As shown in FIG. 10, first pixel signals output by the first pixel circuits OPC, which are connected to different first column lines OC0 and OC1, may be simultaneously detected. Second pixel signals output by the second pixel circuits SPC, which are connected to different second column lines SC0 and SC1, may also be simultaneously detected. For example, when intersection points of the column lines OC0, OC1, SC0 and SC1 and the row lines R0 to R15 are defined as addresses of respective pixels PX, first pixel signals, respectively output by a first pixel circuit OPC[0,0] of a pixel located at an address [0,0] and by a first pixel circuit OPC[4,0] of a pixel located at an address [4,0], may be simultaneously detected by a first readout circuit. Second pixel signals, respectively output by a second pixel circuit SPC[0,0] of a pixel located at an address [0,0] and a second pixel circuit SPC[4,0] of a pixel located at an address [4,0], may be simultaneously detected by a second readout circuit.

In the case in which the pixel signal is detected in the manner described above, the first pixel circuit OPC and the second pixel circuit SPC, in which pixel signals are detected in each scanning period, may be included in a same pixel. Thus, a noise component occurring due to a difference in pixel coordinates between pixels PX, by which a pixel signal is detected, may be reduced. In addition, a reordering process in which image data generated by digitizing a pixel signal is reordered may be simplified. Further, since the pixel signals are detected from the first pixel circuit OPC and the second pixel circuit SPC included in a single pixel PX during each scanning period, the operations and/or circuitry of the row driver may be simplified.

Figure 11A:
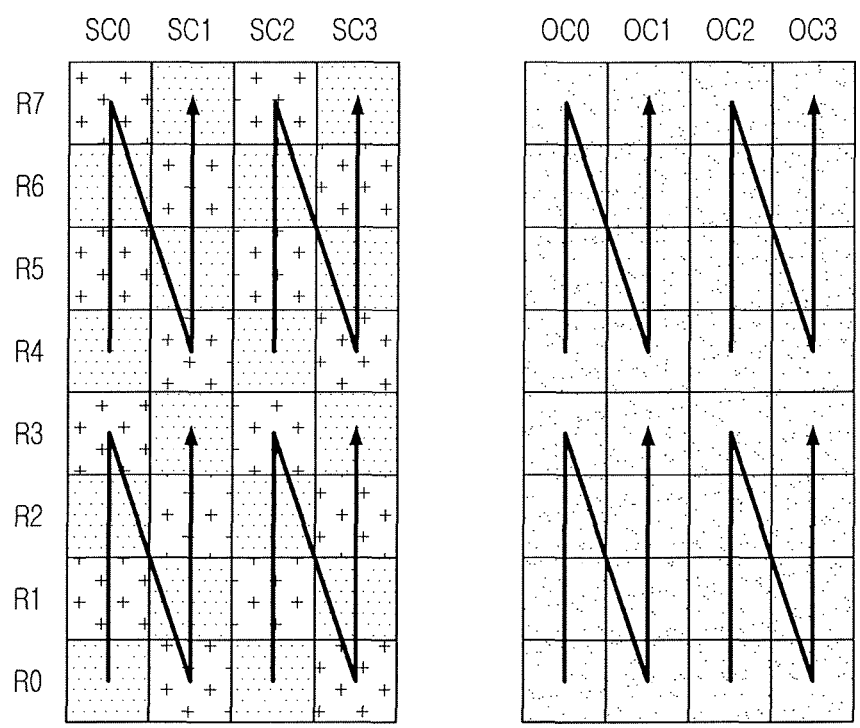
FIGS. 11A and 11B are diagrams illustrating a pixel signal detection method of an image sensor according to an exemplary embodiment of the inventive concept.
Figure 11B:
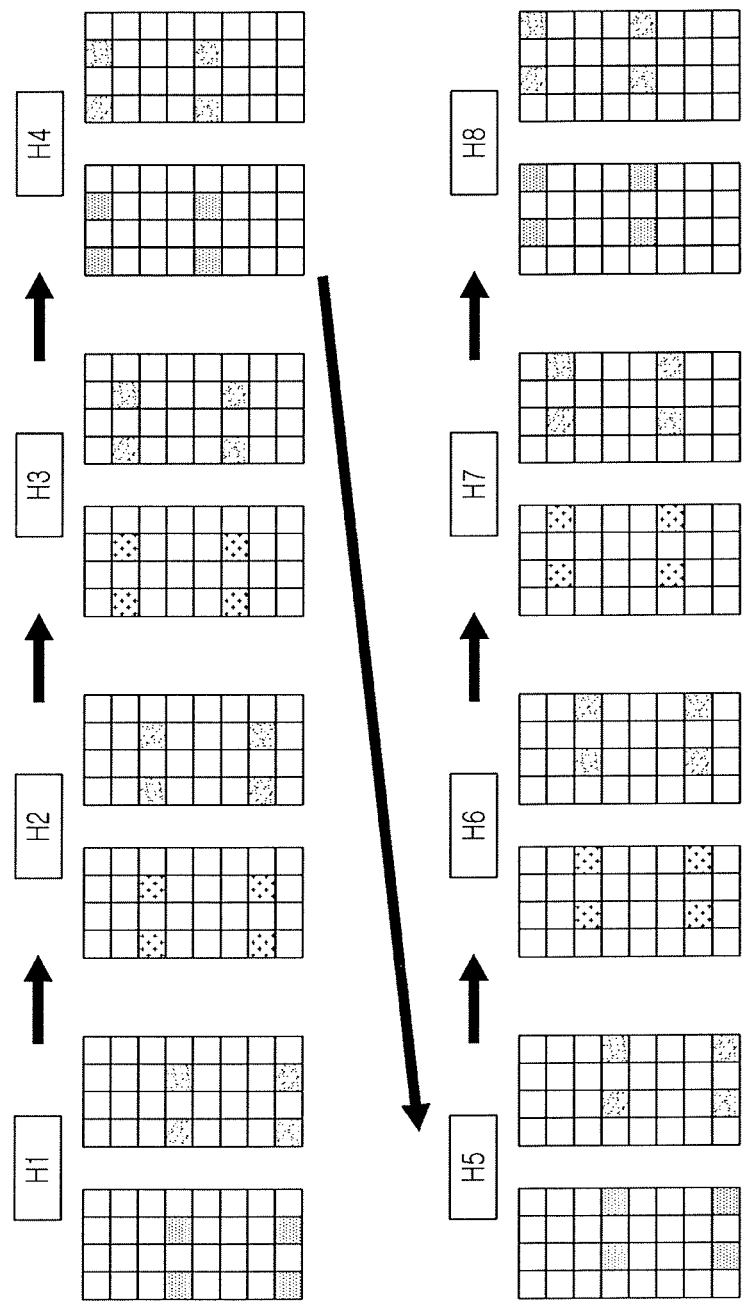

FIGS. 11A and 11B are diagrams illustrating a pixel signal detection method of an image sensor according to an exemplary embodiment of the inventive concept.

FIGS. 11A and 11B illustrate pixels PX which share column lines as described in FIG. 10. Referring to FIG. 11A, during a first scanning period H1, first and second pixel signals may be simultaneously detected from the first pixel circuits and the second pixel circuits included in four respective pixels PX located at addresses [0,0], [4,0], [0,2] and [4,2]. For example, the addresses of the pixels PX from which the first and second pixel signals are detected in the first scanning period H1 may be the same as those described with reference to FIGS. 7A and 7B.

The arrangement of pixels PX and/or pixel groups of FIG. 10 may be different from the arrangement of the pixels PX and/or pixel groups of FIG. 6. In FIG. 10, pixel addresses outputting first and second pixel signals in a second scanning period H2 may be [1,0], [4,1], [1,2] and [4,2]. For example, in FIGS. 11A and 11B, the addresses of the pixels PX may be vertically shifted after the lapse of a scanning period. Thus, pixel signal detection directions may be different from each other depending on the elapse of a scanning period.

Figure 12:
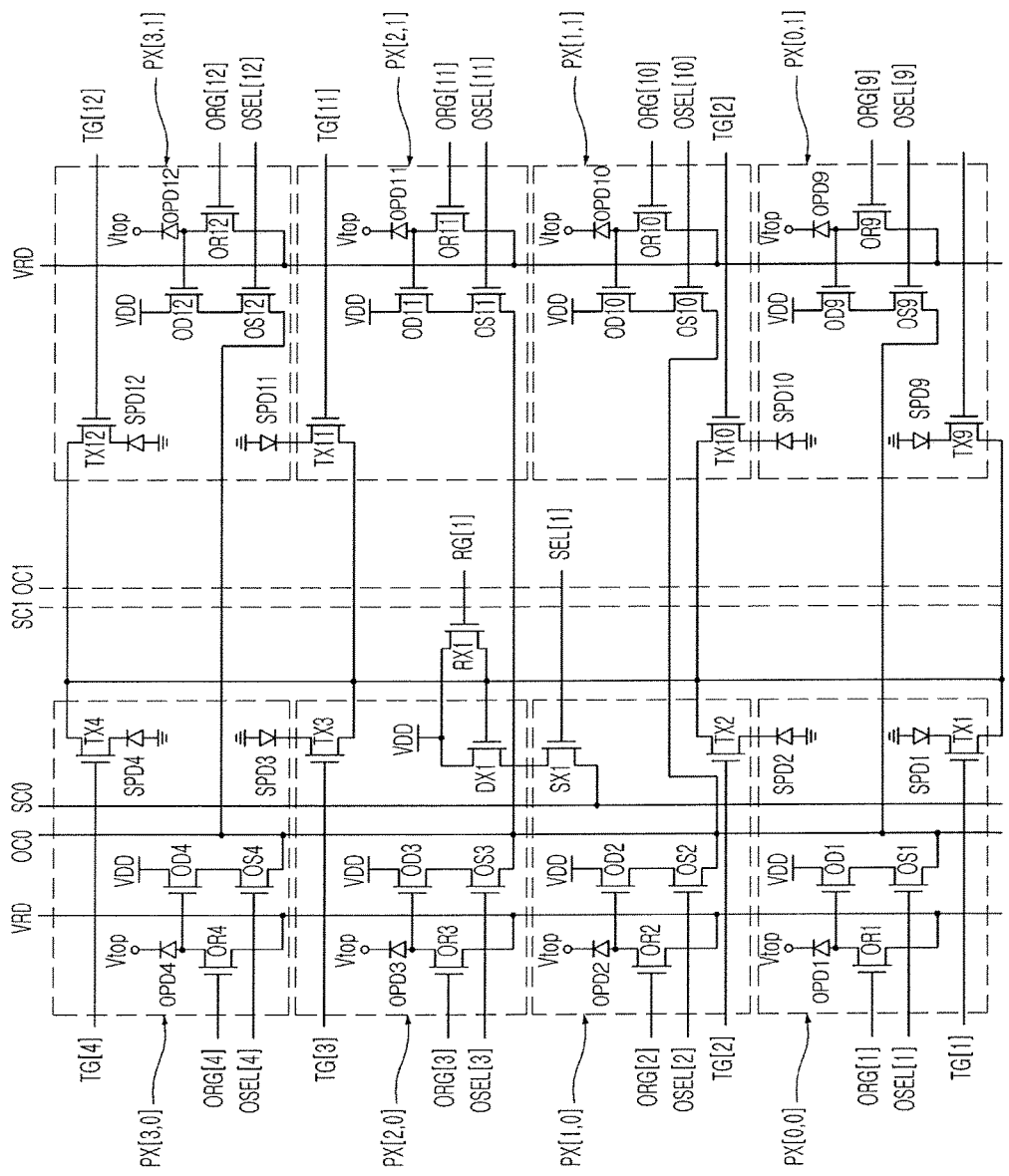
FIGS. 12 and 13 are circuit illustrating a connection structure of pixel circuits and column lines included in an image sensor according to an exemplary embodiment of the inventive concept.
Figure 13:
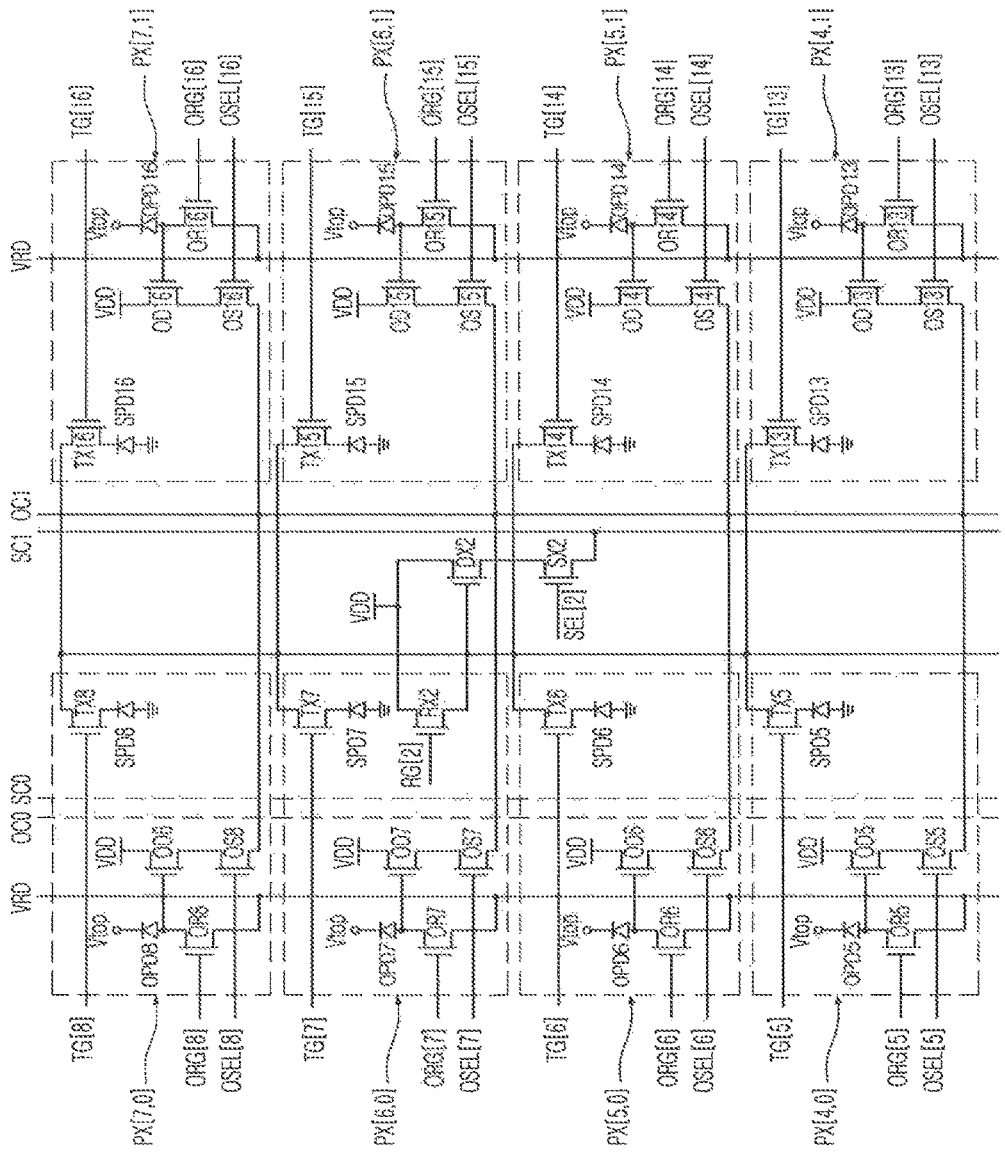

FIGS. 12 and 13 are circuit drawings illustrating a connection structure of pixel circuits and column lines included in an image sensor according to an exemplary embodiment of the inventive concept.

FIG. 12 illustrates pixel groups corresponding to the first pixel group 501 and the second pixel group 502 of FIG. 10. Referring to FIG. 12, eight pixels PX arranged in a 4×2 matrix may be included in a first pixel group 501 and a second pixel group 502. In each group, four pixels PX may be arranged in a 4×1 matrix form. Four pixels PX included in the first pixel group 501 and four pixels PX included in the second pixel group 502 may include first pixel circuits connected to organic photodiodes OPD1 to OPD4 and OPD9 to OPD12, and second pixel circuits connected to semiconductor photodiodes SPD1 to SPD4 and SPD9 to SPD12. The first pixel circuits included in the first pixel group 501 and the second pixel group 502 may share a first column line OC0, and the second pixel circuits included in the first pixel group 501 and the second pixel group 502 may share a second column line SC0. Within the first pixel group 501 and the second pixel group 502, the second pixel circuit may share transistors RX1, DX1 and SX1, except for transmission transistors TX1 to TX4 and TX9 to TX12.

In a first scanning period H1, a selection transistor OS1 included in a pixel PX[0,0], corresponding to an address [0,0], may be turned on, and all other selection transistors OS2 to OS4 and OS9 to OS12 included in other pixels PX in the first and second pixel groups 501 and 502 may be turned off. Thus, a first pixel signal generated from an electrical charge of an organic PD OPD1 included in the pixel PX[0,0], corresponding to the address [0,0], may be output through the first column line OC0 during the first scanning period H1.

In the first scanning period H1, the transmission transistor TX1 of the pixel PX[0,0], corresponding to the address [0,0], may be turned on. During the first scanning period H1, all other transmission transistors TX2 to TX4 and TX9 to TX12 included in other pixels PX of the first and second pixel groups 501 and 502 may be turned off. Thus, a second pixel signal generated from an electrical charge of a semiconductor PD SPD1 included in the pixel PX[0,0], corresponding to the address [0,0], may be output through the second column line SC0 during the first scanning period H1. For example, in the first and second pixel groups 501 and 502, the first pixel circuit and the second pixel circuit included in a single pixel PX may be connected to the first column line OC0 and the second column line SC0 in respective scanning periods H1 to H8. For example, in different scanning periods, from among the scanning periods H1 to H8, a different pixel PX, from among the first and second pixel groups 501 and 502 may be connected to the first column line OC0 and to the second column line SC0.

FIG. 13 illustrates pixel groups corresponding to the third pixel group 503 and the fourth pixel group 504 illustrated in FIG. 10. With reference to FIG. 13, each of four pixels PX included in the third pixel group 503 and each of four pixels PX included in the fourth pixel group 504 may include a first pixel circuit and a second pixel circuit. The first pixel circuits included in the third pixel group 503 and the fourth pixel group 504 may share a single first column line OC1 and the second pixel circuits may share a single second column line SC1.

The first column line OC1 shared by the first pixel circuits included in the third pixel group 503 and the fourth pixel group 504 may be different from the first column line OC0 shared by the first pixel circuits included in the first pixel group 501 and the second pixel group 502. In addition, the second column line SC1 shared by the second pixel circuits included in the third pixel group 503 and the fourth pixel group 504 may be different from the second column line SC0 shared by the second pixel circuits included in the first pixel group 501 and the second pixel group 502. Thus, pixel signals may be simultaneously detected from pixels PX included in the first pixel group 501 and the second pixel group 502, and pixels PX included in the third pixel group 503 and the fourth pixel group 504.

In an exemplary embodiment of the inventive concept, in a first scanning period H1, a selection transistor OS5 included in a pixel PX[4,0], corresponding to an address [4,0], may be turned on, and all other selection transistors OS6 to OS8 and OS13 to OS16 included in the third pixel group 503 and the fourth pixel group 504 may be turned off. Thus, a first pixel signal generated from an electrical charge of an organic photodiode OPD5 included in the pixel PX[4,0], corresponding to the address [4,0], may be output through the first column line OC1 during the first scanning period H1.

In addition, in the first scanning period H1, a transmission transistor TX5 included in the pixel PX[4,0], corresponding to the address [4,0], may be turned on, and all other transmission transistors TX6 to TX8 and TX13 to TX16 included in the third pixel group 503 and the fourth pixel group 504 may be turned off. Thus, a second pixel signal generated from an electrical charge of a semiconductor photodiode SPD5 included in the pixel PX[4,0], corresponding to the address [4,0], may be output through the second column line SC1 during the first scanning period H1. Thus, from pixels PX included in pixel groups sharing first column lines OC0 and OC1, which are different from each other, or second column lines SC0 and SC1, which are different from each other, the first pixel signal and the second pixel signal may be simultaneously detected.

Figure 14:
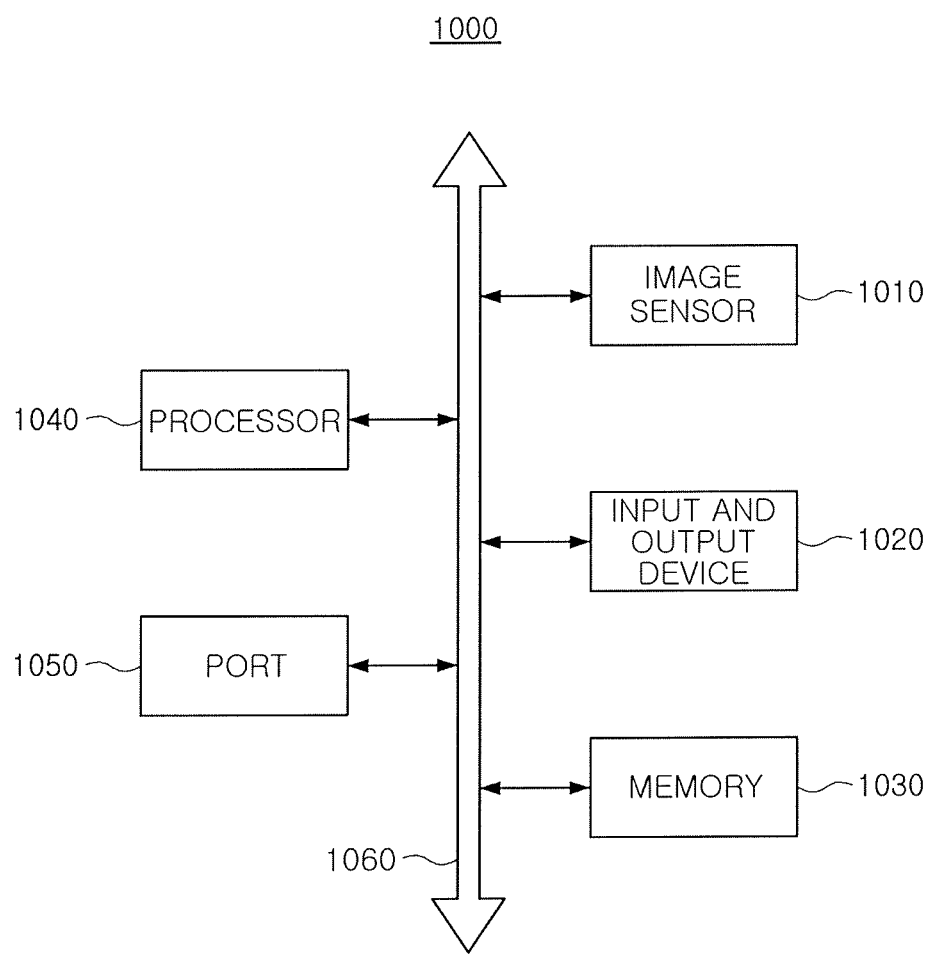
FIG. 14 is a diagram illustrating an electronic device which includes an image sensor according to an exemplary embodiment of the inventive concept.

FIG. 14 is a diagram illustrating an electronic device which includes an image sensor according to an exemplary embodiment of the inventive concept.

Referring to FIG. 14, an image sensor 1010 may be applied to a computer device 1000. The computer device 1000 illustrated in FIG. 14 may include an input/output device 1020, a memory 1030, a processor 1040, a port 1050, and the like, as well as the image sensor 1010. In addition, the computer device 1000 may further include a wired/wireless communications device, a power supply device, and the like. Among the elements illustrated in FIG. 14, the port 1050 may be a device provided to allow the computer device 1000 to communicate with a video card, a sound card, a memory card, a universal serial bus (USB) device, and the like. The computer device 1000 may be, for example, a smartphone, a tablet personal computer (PC), a smart wearable device, a desktop computer, a laptop computer, etc.

The processor 1040 may perform specific arithmetic operations, commands, tasks, and the like. The processor 1040 may be a central processing unit (CPU) or a microprocessor unit (MCU), and may communicate with the memory device 1030, the input/output device 1020, the image sensor 1010, and other devices connected to the port 1050, via a bus 1060.

The memory 1030 may be a storage medium storing data necessary for operations of the computer device 1000, multimedia data, or the like. The memory 1030 may include a volatile memory, such as a random access memory (RAM), or a non-volatile memory, such as a flash memory, and the like. In addition, the memory 1030 may include at least one of a solid state drive (SSD), a hard disk drive (HDD), and an optical drive (ODD), as a storage device. The input/output device 1020 may include an input device such as a keyboard, a mouse, a touch screen, and the like, for a user, and an output device such as a display, an audio output unit, and the like.

The image sensor 1010 may be connected to the processor 1040 by the bus 1060 or other communication circuits. The processor 1040 may execute a function of the image processor 20 illustrated in FIG. 1. The image sensor 1010 may be provided as described above.

For example, the image sensor 1010 may include a plurality of pixels PX, and two or more adjacent pixels PX may form a pixel group. As pixel circuits included in each of pixels PX within a single pixel group share one column line, pixel signals may be detected from the pixel circuits included in a single pixel during each scanning period. Thus, for example, when the pixel signal is detected, a coupling component occurring in organic photodiodes and semiconductor photodiodes stacked in pixels PX may be removed. Thus, the occurrence of fixed pattern noise in a horizontal direction may be reduced or eliminated. In addition, since a pixel signal may be prevented from being detected from pixel circuits included in different pixels PX in each scanning period, a reordering process of image data may be simplified.

As set forth above, first pixel circuits connected to first photoelectric elements included in respective pixels PX adjacent to each other may share a single column line, and second pixel circuits connected to second photoelectric elements may also share a single column line. Pixel signals may be detected from first and second pixel circuits to simplify a data reordering process, and noise occurring due to a coupling difference between first and second photoelectric elements may be reduced.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An image sensor comprising:
   a plurality of row lines extending in a first direction;
   a plurality of column lines including a plurality of first column lines and a plurality of second column lines, wherein the plurality of column lines intersects the plurality of row lines; and
   a plurality of pixels arranged along the plurality of row lines and the plurality of column lines, wherein the plurality of pixels includes a plurality of pixel groups, wherein each of the plurality of pixel groups includes two or more pixels,
   wherein each pixel of the plurality of pixels includes a first photoelectric element, a second photoelectric element, a first pixel circuit connected to the first photoelectric element, and a second pixel circuit connected to the second photoelectric element, and
   wherein, in each pixel group of the plurality pixel groups, the first pixel circuits share one of the plurality of first column lines and the second pixel circuits share one of the plurality of second column lines.

2. The image sensor of claim 1, wherein the first photoelectric element is an organic photodiode and the second photoelectric element is a semiconductor photodiode.

3. The image sensor of claim 1, wherein the number of transistors included in the first pixel circuit is smaller than the number of transistors included in the second pixel circuit.

4. The image sensor of claim 1, wherein, in each pixel group of the plurality pixel groups, the first pixel circuits are sequentially connected to one of the plurality of first column lines and the second pixel circuits are sequentially connected to one of the plurality of second column lines.

5. The image sensor of claim 4, wherein in each pixel group of the plurality of pixel groups, an order in which the first pixel circuits are connected to the one of the plurality of first column lines is identical to an order in which the second pixel circuits are connected to the one of the plurality of second column lines.

6. The image sensor of claim 1, wherein the pixels included in each of the plurality of pixel groups are arranged in a square matrix.

7. The image sensor of claim 1, wherein the first pixel circuit comprises a floating diffusion in which electrical charges generated by the first photoelectric element are accumulated, a reset transistor resetting a voltage of the floating diffusion, a source follower transistor amplifying the voltage of the floating diffusion to generate a first pixel signal, and a selection transistor outputting the first pixel signal to one of the first column lines, and
   wherein the floating diffusion is directly connected to the first photoelectric element by a via.

8. The image sensor of claim 1, wherein the second pixel circuit comprises a floating diffusion in which electrical charges generated by the second photoelectric element are accumulated, a reset transistor resetting a voltage of the floating diffusion, a transmission transistor transferring the electrical charges generated by the second photoelectric element to the floating diffusion, a source follower transistor amplifying the voltage of the floating diffusion to generate a second pixel signal, and a selection transistor outputting the second pixel signal to one of the second column lines.

9. The image sensor of claim 8, wherein, in each pixel group, the second pixel circuits which share the one of the plurality of second column lines share the floating diffusion, the source follower transistor, the reset transistor, and the selection transistor.

10. The image sensor of claim 1, further comprising:
    a row decoder circuit for selecting a portion of the plurality of pixels for each predetermined scanning period, wherein the row decoder circuit inputs a first scanning signal to the first pixel circuit of each pixel of the selected portion of the plurality of pixels, and the row decoder circuit inputs a second scanning signal to the second pixel circuit of each pixel of the selected portion of the plurality of pixels;
    a first readout circuit connected to the first column lines, wherein the first readout circuit detects a first pixel signal output by the first pixel circuit of each pixel of the selected portion of the plurality of pixels; and
    a second readout circuit connected to the second column lines, wherein the second readout circuit detects a second pixel signal output by the second pixel circuit of each pixel of the selected portion of the plurality of pixels.

11. The image sensor of claim 10, wherein the row decoder circuit inputs the first scanning signal to a selection transistor included in the first pixel circuit at the each scanning period, and
    wherein the row decoder circuit inputs the second scanning signal to a transmission transistor included in the second pixel circuit at the each scanning period.

12. An image sensor comprising a plurality of row lines, a plurality of column lines crossing the plurality of row lines, and a plurality of pixels arranged along the plurality of row and column lines,
    wherein each of the plurality of pixels includes:
    an organic photodiode for generating first charges from light having a first wavelength band;
    a semiconductor photodiode for generating second charges from light having a second wavelength band different from the first wavelength band, wherein the organic and semiconductor photodiodes are stacked on each other;
    a first pixel circuit generating a first pixel signal from the first charges; and
    a second pixel circuit generating a second pixel signal from the second charges,
    wherein a plurality of first pixel circuits of a group of adjacent pixels of the plurality of pixels is connected to a first column line of the plurality of column lines, and a plurality of second pixels circuits of the plurality of the group of adjacent pixels is connected to a second column line of the plurality of column lines, and
    wherein, during a scanning period, the first pixel circuit of one of the group of adjacent pixels transmits the first pixel signal to the first column line, and the second pixel circuit of one of the group of adjacent pixels transmits the second pixel signal to the second column line.

13. The image sensor of claim 12, wherein the number of transistors included in the first pixel circuit is smaller than the number of transistors included in the second pixel circuit.

14. The image sensor of claim 12, wherein the first charges and the second charges are of different conductivity types.

15. The image sensor of claim 12, wherein the organic photodiode generates the first charges from green light, and the semiconductor photodiode generates the second charges from red light or blue light.

16. An image sensor comprising:
a plurality of pixels arranged in a matrix form;
a plurality of row lines; and
plurality of column lines intersecting the plurality of row lines,
wherein each pixel of the plurality of pixels includes a first photoelectric element for detecting light of a first color, a second photoelectric element for detecting light of a second color different from the first color, a first pixel circuit connected to the first photoelectric element, and a second pixel circuit connected to the second photoelectric element,
wherein a first pixel group of the plurality of pixels includes a first pixel and a second pixel, the first pixel circuit of each of the first and second pixels is connected to a first column line, and the second pixel circuit of each of the first and second pixels is connected to a second column line,
wherein a second pixel group of the plurality of pixels includes a third pixel and a fourth pixel, the first pixel circuit of each of the third and fourth pixels is connected to a third column line, and the second pixel circuit of each of the third and fourth pixels is connected to a fourth column line,
wherein the first and third column lines are connected to a first readout circuit, and the second and fourth column lines are connected to a second readout circuit.

17. The image sensor of claim 16, wherein second photoelectric element is disposed between the first photoelectric element and the first pixel circuit.

18. The image sensor of claim 17, wherein the first pixel circuit and the first photoelectric element are connected to each other by a via, wherein the via passes through a layer in which the second photoelectric element is disposed.

19. The image sensor of claim 16, wherein first photoelectric element is an organic photodiode and the second photoelectric element is a semiconductor photodiode.

20. The image sensor of claim 16, further comprising a color filter disposed between the first and second photoelectric elements.

* * * * *